(12) United States Patent
Arita

(10) Patent No.: US 9,121,990 B2
(45) Date of Patent: Sep. 1, 2015

(54) PLANAR LIGHT SOURCE APPARATUS AND DISPLAY APPARATUS USING THE SAME

(75) Inventor: Kenji Arita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 157 days.

(21) Appl. No.: 13/477,229

(22) Filed: May 22, 2012

(65) Prior Publication Data

US 2012/0307507 A1 Dec. 6, 2012

(30) Foreign Application Priority Data

May 31, 2011 (JP) ................................. 2011-122216

(51) Int. Cl.
| | |
|---|---|
| *H05K 1/00* | (2006.01) |
| *H05K 1/18* | (2006.01) |
| *H05K 7/00* | (2006.01) |
| *H05K 7/12* | (2006.01) |
| *B64D 47/06* | (2006.01) |

(Continued)

(52) U.S. Cl.
CPC ................ *G02B 6/0083* (2013.01); *H05K 1/00* (2013.01); *H05K 1/118* (2013.01); *H05K 7/02* (2013.01); *G02B 6/009* (2013.01); *H05K 1/028* (2013.01); *H05K 3/361* (2013.01)

(58) Field of Classification Search
CPC ........... H05K 7/02; H05K 1/00; H05K 1/028; H05K 1/118; H05K 3/361; H05K 2201/05; H05K 2201/056; H05K 2201/2027
USPC ......... 361/752, 749, 748, 767; 362/559, 97.1; 349/1, 58

See application file for complete search history.

(56) References Cited

U.S. PATENT DOCUMENTS

| | | | |
|---|---|---|---|
| 6,972,963 B1 * | 12/2005 | Chou | ............................ 361/760 |
| 7,708,449 B2 * | 5/2010 | Eda | ............................... 362/631 |

(Continued)

FOREIGN PATENT DOCUMENTS

| | | | | |
|---|---|---|---|---|
| CN | 101178493 A | * | 5/2008 | |
| CN | 101178493 A | * | 5/2008 | .............. G02F 1/133 |

(Continued)

OTHER PUBLICATIONS

Combined Chinese Office Action and Search Report issued Mar. 3, 2014 in Patent Application No. 201210175346.6 with English Translation.

(Continued)

*Primary Examiner* — Courtney Smith
*Assistant Examiner* — Zhengfu Feng
(74) *Attorney, Agent, or Firm* — Oblon, McClelland, Maier & Neustadt, L.L.P.

(57) ABSTRACT

A planar light source apparatus includes a light source; a flexible printed circuit (FPC) having a wiring part that extends from a light source mounting part having the light source; a rear frame that accommodates the light source and the FPC; and a driver substrate, which is arranged on a backside that is an opposite side of an inner surface of the rear frame, and which has a connector configured to connect the FPC, wherein an end portion of the wiring part is extracted to the backside through an opening hole formed in the rear frame and is connected to the connector, and wherein the backside of the rear frame has a protrusion portion, which is arranged in the vicinity of an insertion slot of the connector, and is which formed to be substantially level with an arrangement position of the insertion slot.

17 Claims, 6 Drawing Sheets

(51) Int. Cl.

| | | |
|---|---|---|
| *G09F 13/04* | (2006.01) | |
| *G09F 13/08* | (2006.01) | |
| *G02F 1/13* | (2006.01) | |
| *G02F 1/1333* | (2006.01) | |
| *F21V 8/00* | (2006.01) | |
| *H05K 7/02* | (2006.01) | |
| *H05K 1/11* | (2006.01) | |
| *H05K 1/02* | (2006.01) | |
| *H05K 3/36* | (2006.01) | |

(56) References Cited

U.S. PATENT DOCUMENTS

| | | | |
|---|---|---|---|
| 2007/0128893 A1* | 6/2007 | Wu et al. | 439/74 |
| 2008/0264484 A1 | 10/2008 | Temchenko et al. | |
| 2010/0073888 A1* | 3/2010 | Azuma et al. | 361/749 |
| 2010/0259905 A1* | 10/2010 | Tanno | 361/749 |
| 2011/0090652 A1* | 4/2011 | Wee et al. | 361/749 |

FOREIGN PATENT DOCUMENTS

| | | | | |
|---|---|---|---|---|
| CN | 101216633 A | | 7/2008 | |
| CN | 201093367 Y | * | 7/2008 | |
| CN | 101493218 A | * | 7/2009 | |
| CN | 101909768 A | | 12/2010 | |
| CN | 201731392 U | * | 2/2011 | |
| JP | 6-265921 | | 9/1994 | |
| JP | 8-114802 A | | 5/1996 | |
| JP | 2005-189448 A | | 7/2005 | |
| JP | 2006-114317 A | | 4/2006 | |
| JP | 2007-194067 A | | 8/2007 | |
| JP | 2009-69792 A | | 4/2009 | |
| JP | 2010-80148 A | | 4/2010 | |
| JP | 2011-22192 A | | 2/2011 | |
| JP | 2011-90842 A | | 5/2011 | |
| KR | 10-2004-0061873 A | | 7/2004 | |
| KR | 20040061873 A | * | 7/2004 | H01R 12/24 |
| WO | WO 2010/004798 A1 | | 1/2010 | |

OTHER PUBLICATIONS

Combined Chinese Office Action and Search Report issued Sep. 2, 2014 in Patent Application No. 201210175346.6 (with English language translation).

Office Action issued Dec. 11, 2014 in Chinese Patent Application No. 201210175346.6 (with English language translation).

Office Action issued in Jan. 20, 2015 in Japanese Patent Application No. 2011-122216 (with English language translation).

* cited by examiner

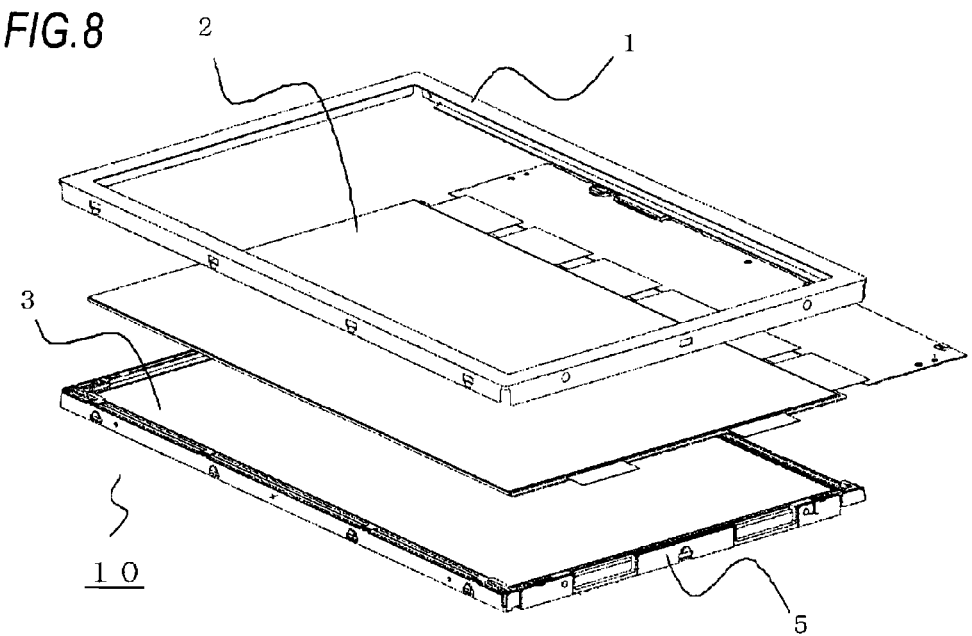
FIG.8
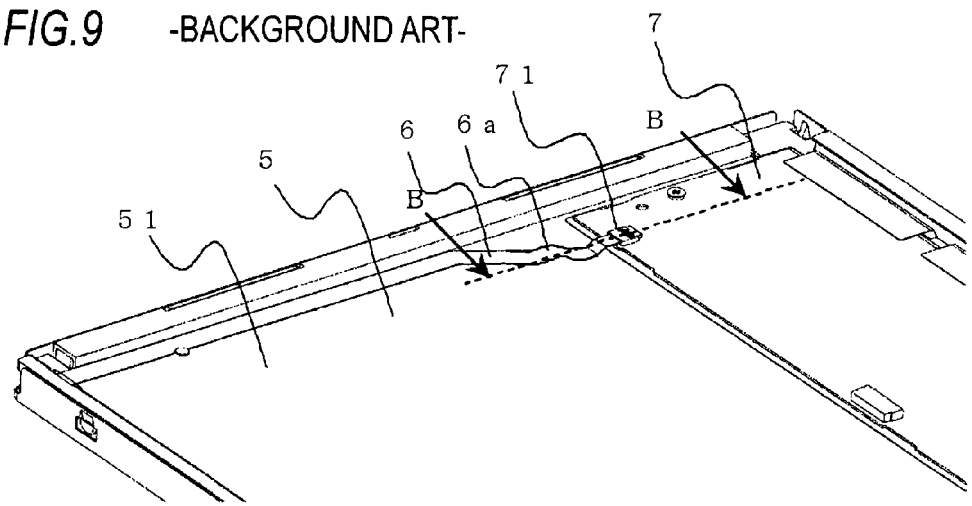
FIG.9 -BACKGROUND ART-

FIG.10   -BACKGROUND ART-
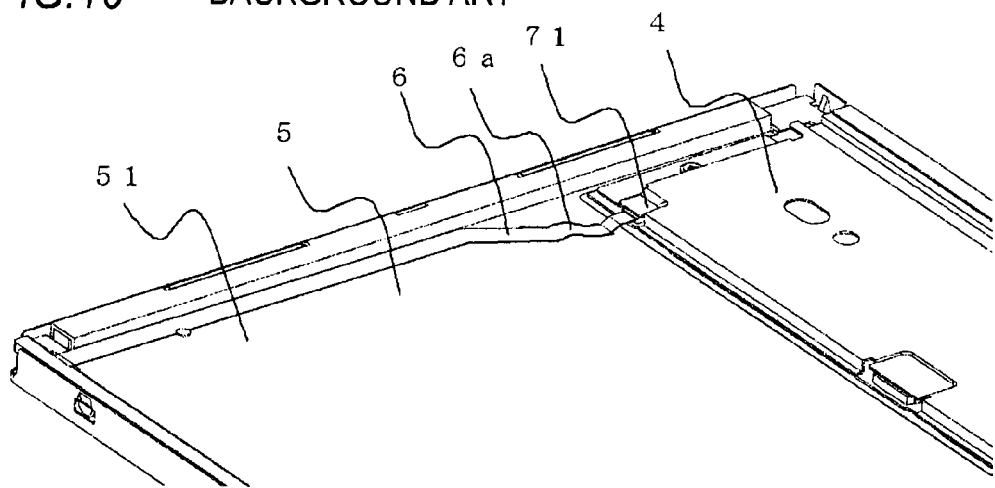
FIG.11   -BACKGROUND ART-
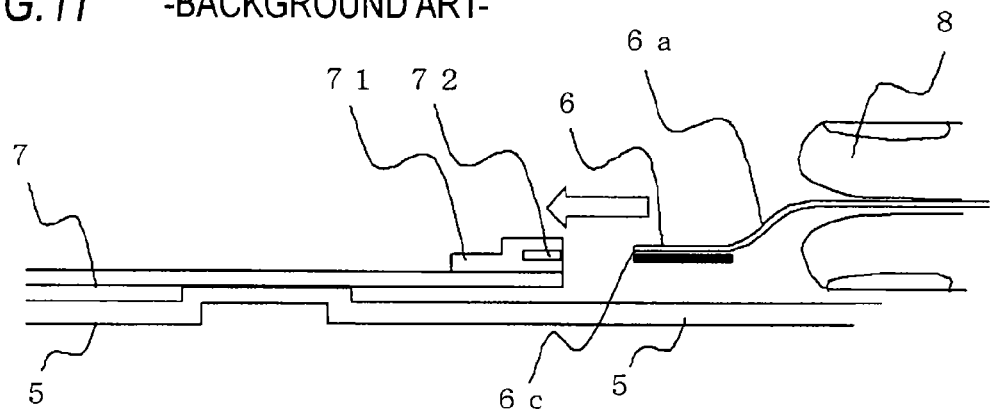
FIG.12   -BACKGROUND ART-
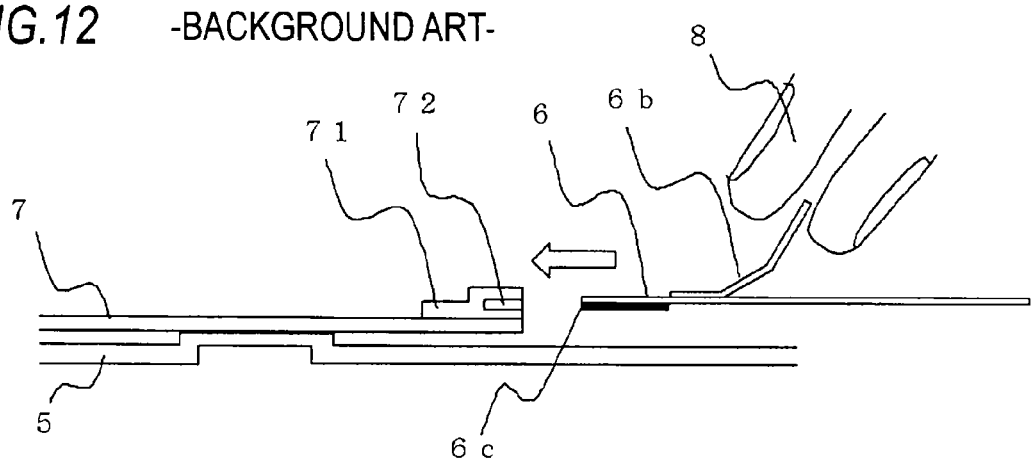

PLANAR LIGHT SOURCE APPARATUS AND DISPLAY APPARATUS USING THE SAME

CROSS-REFERENCE TO RELATED APPLICATION

This application claims priority from Japanese Patent Application No. 2011-122216 filed on May 31, 2011, the entire subject matter of which is incorporated herein by reference.

TECHNICAL FIELD

This disclosure relates to a planar light source apparatus that illuminates a display panel from a backside thereof and a display apparatus having the planar light source apparatus.

BACKGROUND

A display apparatus has a display panel and a light source apparatus that illuminates the display panel from a backside thereof. As the light source apparatus, a planar light source apparatus using an LED (Light Emitting Diode) enabling high brightness and slimming has been widely used. Also, in many cases, a user (consumer) prepares a driver that drives the LED. However, in order to make a smaller housing is designed by the user, it has been recently required to embed an LED driver in the display apparatus.

Here, a background display apparatus is described with reference to the drawings. FIG. 8 is an exploded perspective view of a general display apparatus. As shown in FIG. 8, a display apparatus 10 has a planar light source apparatus 3 that illuminates a display panel 2 displaying an image from a backside thereof, and a front frame 1 and a rear frame 5 configuring the planar light source apparatus 3 are engaged to configure the display apparatus.

FIGS. 9 and 10 are enlarged views of the background display apparatus, which are seen from a backside of the assembled display apparatus of FIG. 8. Hereinafter, the display apparatus is described with reference to the drawings. An LED (not shown) serving as a light source is arranged inside the rear frame 5 configuring the planar light source apparatus 3. The LED is mounted on a flexible printed circuit (FPC) (hereinafter, the FPC having the LED mounted thereon is referred to as LED-FPC). As shown in FIG. 9, an LED-FPC 6 is fixed on a backside 51 of the rear frame 5 by an adhesive (not shown) and the like. Also, an LED driver embedded substrate 7 that supplies power to the LED and drives the LED is arranged on the backside 51 of the rear frame 5 and the LED-FPC 6 is connected to a LED driver connector 71 mounted on the LED driver embedded substrate 7. Also, as shown in FIG. 10, a frame cover 4 protects the LED driver embedded substrate 7 that is arranged on the backside 51 of the rear frame 5. FIGS. 11 and 12 are sectional views seen from a B-B direction with the display apparatus of FIG. 9 being assembled and illustrate aspects when inserting the LED-FPC 6 into the LED driver connector 71. As shown in FIG. 11, when inserting the LED-FPC 6 into an insertion slot 72 of the LED driver connector 71, a user holds the LED-FPC 6 with fingers 8 and inserts an end portion 6c of the LED-FPC 6 into the LED driver connector 71. In this case, a flaccid portion 6a for holding the LED-FPC 6 with the fingers is provided.

However, when inserting the LED-FPC 6 into the insertion slot 72 of the LED driver connector 71, the user holds the flaccid portion 6a of the LED-FPC 6 with the fingers 8 and inserts the LED-FPC 6 into the insertion slot 72 of the LED driver connector 71 while seeing the same with own eyes. Therefore, it is difficult to position the LED-FPC 6 with respect to the LED driver connector 71, so that an assembling operability is deteriorated. Also, when inserting the LED-FPC 6 into the insertion slot 72 of the LED driver connector 71, an end portion 6c of the LED-FPC 6 is caught by the LED driver connector 71 and is thus bent, so that the LED-FPC 6 may be disconnected or the end portion 6c of the LED-FPC 6 may be peeled off. Also, in the assembled display apparatus, another member is caught by the flaccid portion 6a, so that the LED-FPC 6 may be damaged or disconnected from the LED driver connector 71. Also, in the assembled display apparatus, when the LED-FPC 6 is fixed to the rear frame 6 by using a tape (not shown) and the like, in order to suppress the appearance from being deteriorated due to the flaccid portion 6a, the cost is increased.

Also, as shown in FIG. 12, when a strap 6b protruding from the LED-FPC 6 is formed, instead of providing the LED-FPC 6 with the flaccid portion 6a, it is possible to suppress the appearance from being deteriorated. However, another member is caught by the strap 6b, so that the LED-FPC 6 may be pulled out from the LED driver connector 71 and a pattern wiring may be thus disconnected.

Thus, according to a liquid crystal display apparatus disclosed in JP-A-H06-265921, a flat cable is inserted through a hole for connector exposure provided to a lower shield case and an extension part forming an inclined surface that reaches a cable insertion hole of a connector is provided to one side of the hole for connector exposure.

SUMMARY

However, the liquid crystal display apparatus disclosed in JP-A-H06-265921 has a structure where the flat cable is inserted into the connector along the inclined surface, and the connector and an end portion of the flat cable are brought into contact with each other, so that the flat cable may be damaged. Also, it is required to insert with bending the flat cable along the extension part. As a result, a pattern wiring is disconnected, so that the flat cable may be damaged.

In view of the above, this disclosure provides at least a display apparatus having an LED-FPC mounted thereon, which is capable of suppressing damage of the LED-FPC when inserting the LED-FPC into an insertion slot of a connector for LED driver.

A planar light source apparatus of this disclosure comprises: a light source; a flexible printed circuit (FPC), on which the light source is mounted, and which supplies power to the light source, wherein the FPC has a wiring part that extends from a light source mounting part having the light source; a rear frame that accommodates the light source and the FPC; and a driver substrate, which is arranged on a backside that is an opposite side of an inner surface of the rear frame, and which has a connector configured to connect the FPC, wherein an end portion of the wiring part is extracted to the backside through an opening hole formed in the rear frame and is connected to the connector, and wherein the backside of the rear frame has a protrusion portion, which is arranged in the vicinity of an insertion slot of the connector into which the end portion of the wiring part of the FPC is inserted, and is which formed to be substantially level with an arrangement position of the insertion slot.

According to this disclosure, it is possible to suppress the LED-FPC, which is mounted on the display apparatus, from being damaged when inserting the LED-FPC into the insertion slot of the connector for LED driver.

BRIEF DESCRIPTION OF THE DRAWINGS

The foregoing and additional features and characteristics of this disclosure will become more apparent from the following detailed descriptions considered with the reference to the accompanying drawings, wherein:

FIG. 8 is an exploded perspective view of a general display apparatus;

FIG. 9 is an enlarged view of a background display apparatus, as viewed from a backside of the display apparatus;

FIG. 10 is an enlarged view of a background display apparatus, as viewed from a backside of the display apparatus;

FIG. 11 is a sectional view of a background display apparatus; and

FIG. 12 is a sectional view of a background display apparatus.

DETAILED DESCRIPTION

Hereinafter, illustrative embodiments of this disclosure will be described. The below descriptions are to explain the illustrative embodiments of this disclosure, and but this disclosure is not limited thereto. For clarification of the explanations, the descriptions are appropriately omitted and simplified. Also, one skilled in the art can easily change, add and modify respective elements of the illustrative embodiments within the scope of this disclosure.

First Illustrative Embodiment

Figure 1:
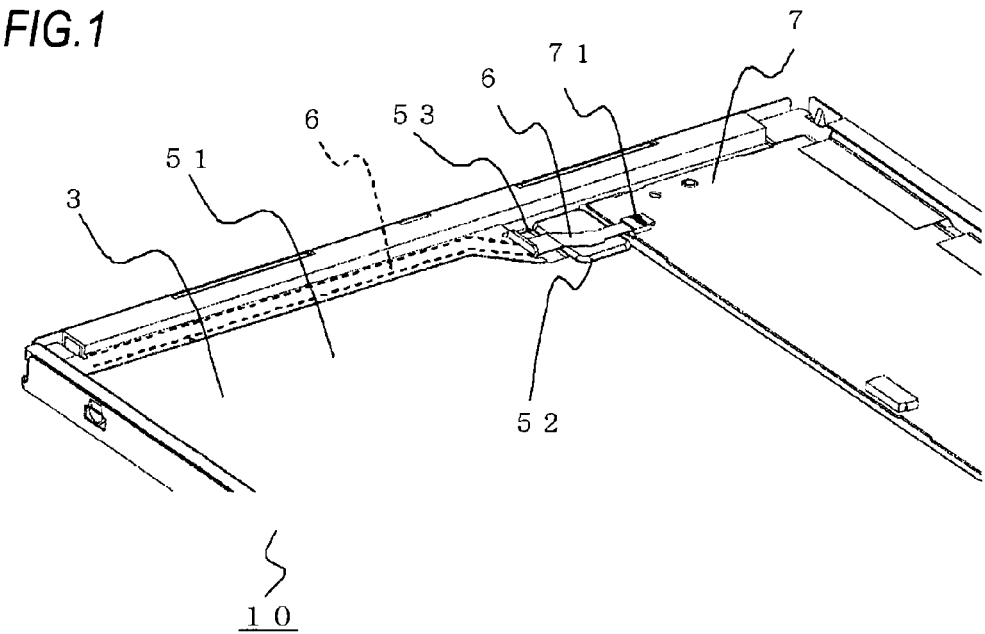
FIG. 1 is an enlarged view of a display apparatus according to an illustrative embodiment of this disclosure, as viewed from a backside of the display apparatus.

A display apparatus of this disclosure is described with reference to the drawings. FIG. 1 is an enlarged view of a display apparatus according to a first illustrative embodiment of this disclosure, as viewed from a backside of the display apparatus. In the meantime, since a schematic configuration of the display apparatus seen from a surface thereof is the same as the general display apparatus shown in FIG. 8, the description thereof is omitted.

As shown in FIG. 1, a display apparatus 10 according to the first illustrative embodiment of this disclosure accommodates a light guide plate configuring a planar light source apparatus 3, an LED serving as a light source emitting light, which are not shown, and an LED-FPC 6 having the LED mounted thereon inside a rear frame 5. Also, an LED driver embedded substrate 7 that supplies power to the LED and drives the LED is arranged on a backside 51 of the rear frame 5. The LED-FPC 6 is connected to a LED driver connector 71 formed on the LED driver embedded substrate 7.

Figure 2:
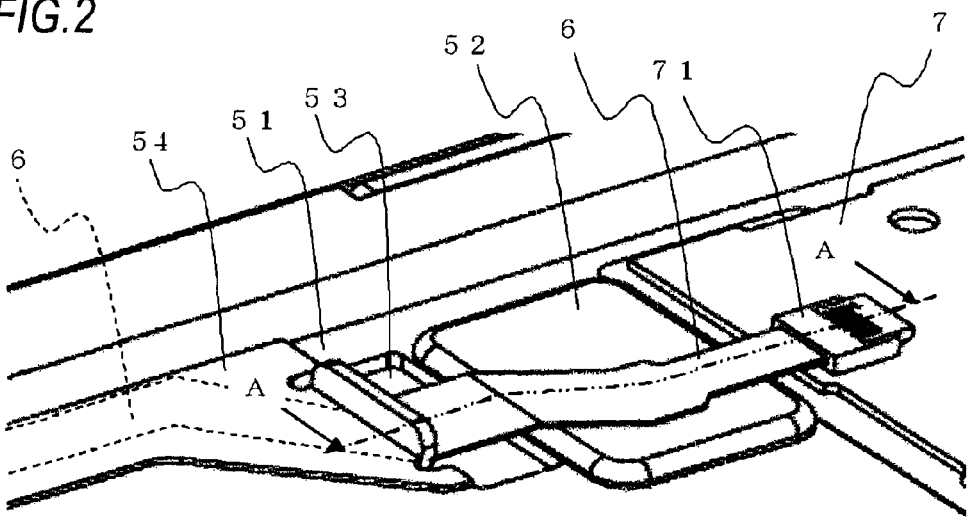
FIG. 2 is an enlarged view of main parts in the vicinity of a connector for LED driver.
Figure 3A:
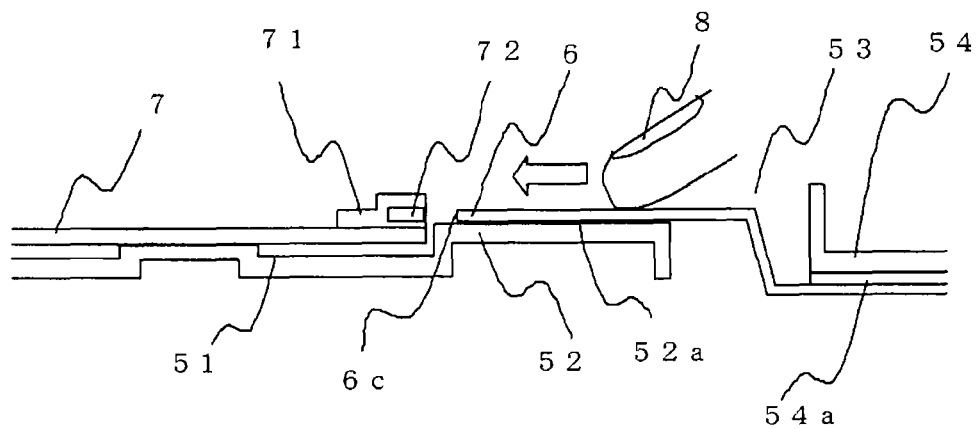
FIGS. 3A and 3B are sectional views taken along a line A-A of FIG. 2.
Figure 3B:
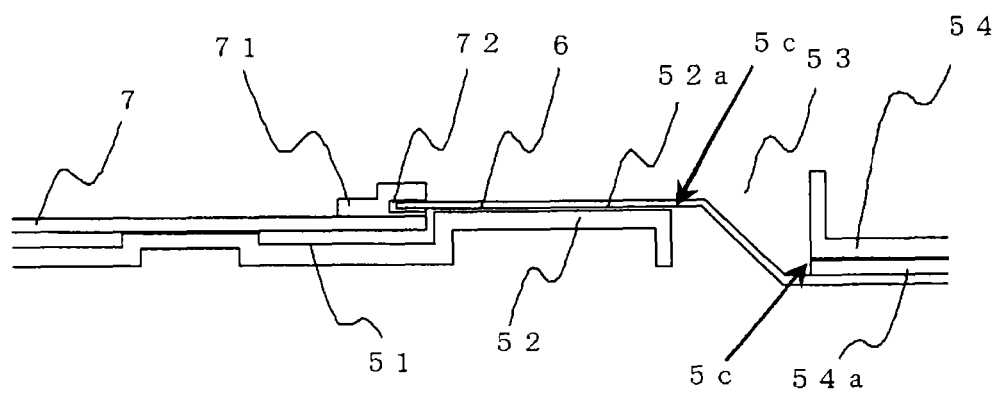

FIG. 2 is an enlarged view of main parts in the vicinity of the LED driver connector 71 and FIG. 3 is a sectional view taken along a line A-A of FIG. 2. In the meantime, FIG. 3A is a sectional view of a state before the LED-FPC 6 is connected to the LED driver connector 71, and FIG. 3B is a sectional view of a state where the LED-FPC 6 is connected to the LED driver connector 71. The configuration of the display apparatus of this disclosure is more specifically described with reference to FIGS. 2 and 3. At the inside of the rear frame 5, a light source mounting part of the LED-FPC 6 is positioned and fixed on a light source arranging side of the rear frame 5 (not shown). Also, a wiring part of the LED-FPC 6 extending from the light source mounting part is fixed and accommodated on an inner side of a convex part 54, which is provided on the backside 51 of the rear frame 5, by using a double-sided tape 54a and the like. At this time, a height of the convex part 54 is larger than a size obtained by summing thickness of the LED-FPC 6 and the double-sided tape 54a. Accordingly, the LED-FPC 6 protrudes toward a display surface more than the rear frame 5, so that it is possible to suppress the display problems such as damage of an optical member. Further, the convex part 54 reduces the bending of the wiring part of the LED-FPC 6 when the wiring part is extracted to the backside 51 through an opening hole 53. Accordingly, the convex part 54 is possible to suppress the disconnection of the wiring part.

The wiring part of the LED-FPC 6 is arranged along the convex part 54 and is extracted to the backside 51 through an opening hole 53 provided to the backside 51 of the rear frame 5. An end portion 6c of the extracted wiring part of the LED-FPC 6 is inserted into an insertion slot 72 of the LED driver connector 71. A protrusion 52 that protrudes from the backside 51 is formed on the backside 51 of the rear frame 5 and in the vicinity of the insertion slot 72 of the LED driver connector 71 between the opening hole 53 and the LED driver connector 71. As shown in FIG. 3B, the protrusion 52 is integrally formed with the rear frame so that it is substantially same with an arrangement height of the insertion slot 72 of the LED driver connector 71. Also, an upper surface 52a of the protrusion 52 is formed to be planar so that it is parallel with the insertion slot 72 of the LED driver connector 71.

In the below, a method of connecting the LED-FPC 6 and the LED driver connector 71 according to the first illustrative embodiment of this disclosure is described with reference to FIGS. 3A and 3B. In FIG. 3A, the LED-FPC 6 is extracted to the backside 51 through the opening hole 53 provided to the rear frame 5 and is arranged on the upper surface 52a of the protrusion 52 on the backside 51. As shown in FIG. 3B, by sliding the LED-FPC 6 in parallel with a direction (which is shown with an arrow) facing the insertion slot 72 of the LED driver connector 71 by a finger 8, it is possible to suppress the end portion 6c of the wiring part of the LED-FPC 6 from contacting the other member at the insertion slot 72 of the LED driver connector 71 and to thus simply insert the LED-FPC 6. Therefore, it is possible to suppress the LED-FPC 6 from contacting the other member and being bent and disconnected and to suppress the end portion 6c of the LED-FPC 6 from being damaged.

As described above, according to the display apparatus of this illustrative embodiment, the protrusion 52 provided on the backside of the rear frame 5 is formed so that it is substantially level with the arrangement height of the insertion slot 72 of the LED driver connector 71. Also, by sliding the LED-FPC 6 on the upper surface 52a by the finger 8, it is possible to suppress the end portion 6c of the wiring part of the LED-FPC 6 from contacting the other member at the insertion slot 72 of the LED driver connector 71 and to thus simply insert the LED-FPC 6. Therefore, it is possible to suppress the LED-FPC 6 from contacting the other member and being thus damaged. Also, it is possible to improve the assembling operability. Further, since the LED-FPC 6 does not have the flaccid part and the like, it is possible to suppress the LED-FPC 6 from contacting the other member and being thus damaged and to suppress the LED-FPC 6 from being pulled out from the insertion slot 72 in the assembled display apparatus. Furthermore, since it is not necessary to provide the LED-FPC 6 with the flaccid part and the like, it is possible to reduce the costs.

In the meantime, a corner part 5*c* of the rear frame 5, which is shown in FIG. 3B, is preferably formed to have a curved surface (R surface) so as to suppress the LED-FPC 6 from contacting an end portion of the opening hole 53 or protrusion 52, which are provided to the backside 51 of the rear frame 5, and being damaged when sliding the LED-FPC 6. Since the part at which the LED-FPC 6 and the protrusion 52 or opening hole 53 are arranged to be adjacent to each other has the curved surface, it is possible to suppress the LED-FPC 6 from being damaged.

Figure 4:
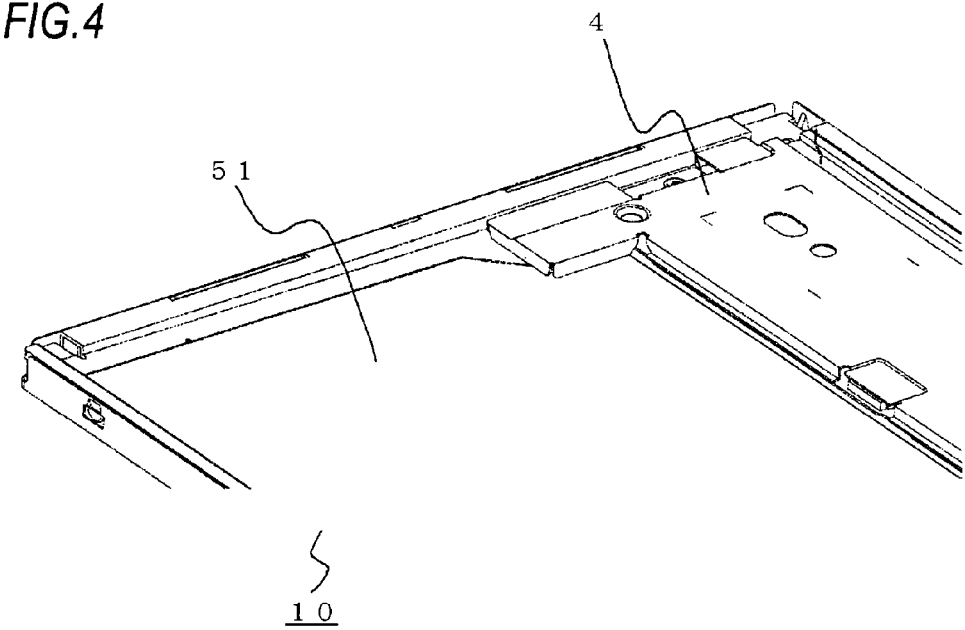
FIG. 4 is an enlarged view of the display apparatus according to an illustrative embodiment of this disclosure, as viewed from a backside of the display apparatus.

Also, according to the display apparatus of this illustrative embodiment, as shown in an enlarged view of FIG. 4, the backside 51 of the rear frame 5 may be provided with a frame cover 4. Since the LED driver embedded substrate 7, the LED driver connector 71, the LED-FPC 6, the opening hole 53 (refer to FIG. 2) and the like, which are arranged on the backside 51 of the rear frame 5, are covered by the frame cover 4, it is possible to suppress the problem that the LED-FPC 6 is brought into contact with the other member, is pulled out from the LED driver connector 71 and is damaged. Also, since the members arranged on the backside of the rear frame 5 are covered by the frame cover 4, it is possible to provide a display apparatus having a good appearance.

In the meantime, in case that the rear frame 5 is formed of a metal thin plate, it is possible to effectively radiate the heat of the light source. In case that the protrusion 52 is formed by drawing or bending processing, it can be easily formed. In case that the rear frame 5 is formed by a molding using a material including resin, it can be easily formed and a light display apparatus can be provided.

Second Illustrative Embodiment

Figure 5:
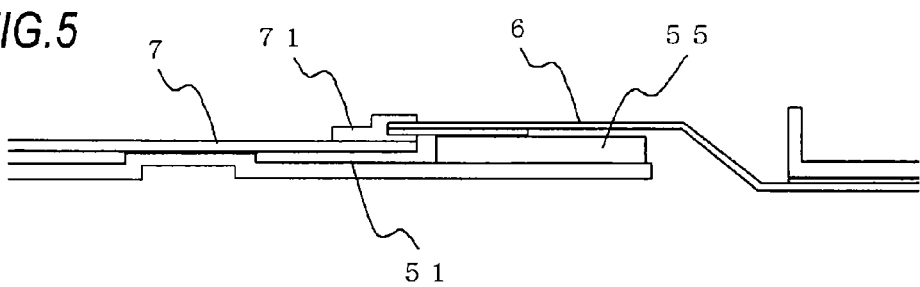
FIG. 5 is a sectional view of a display apparatus according to an illustrative embodiment of this disclosure.

FIG. 5 is a sectional view of a display apparatus according to a second illustrative embodiment. In the first illustrative embodiment, the protrusion 52 is provided on the backside 51 of the rear frame 5. Instead of this configuration, as shown in FIG. 5, a guide spacer 55 may be arranged on the backside 51 of the rear frame 5 so that the LED driver connector 71 is level with the insertion slot 72. When the structure of arranging the guide spacer 55 is adopted, it is possible to arrange the guide spacer 55 in corresponding with the height of the insertion slot 72. Also, even when the height of the insertion slot 72 is changed, it is possible to appropriately adjust the guide spacer 55. In the meantime, the material of the guide spacer 55 is not limited, and various modifications can be made by using a material enabling the height of the spacer member to be adjusted. In the meantime, except for the above configuration, the other configurations are the same as the first illustrative embodiment.

Third Illustrative Embodiment

Figure 6:
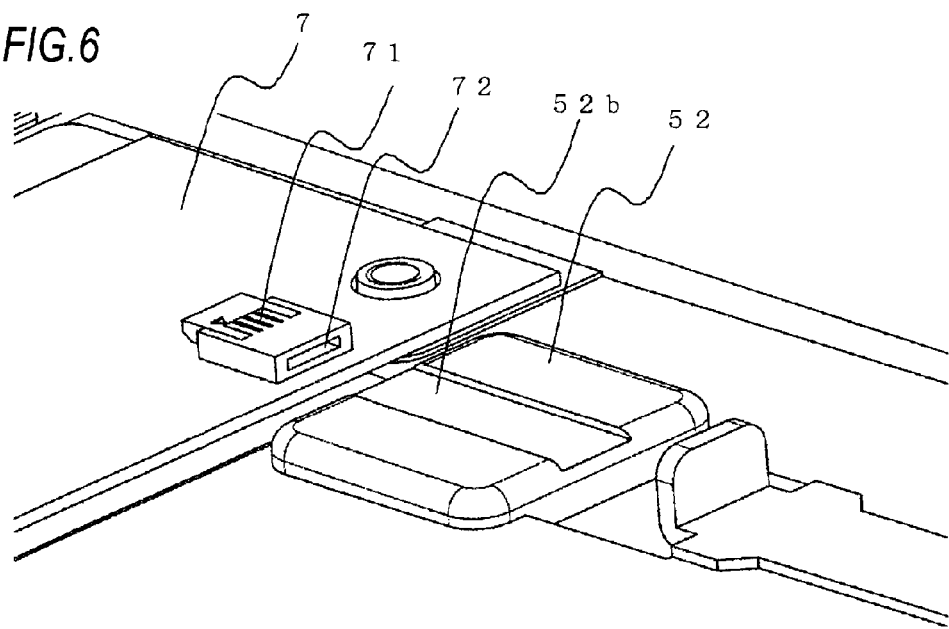
FIG. 6 is an enlarged view of a display apparatus according to an illustrative embodiment of this disclosure, as viewed from a backside of the display apparatus.

FIG. 6 is an enlarged view of a display apparatus according to a third illustrative embodiment. In the first and second illustrative embodiments, the rear frame 5 is provided with the protrusion 52 or spacer member 55. However, in the third illustrative embodiment, as shown in FIG. 6, the upper surface 52*a* of the protrusion 52 is provided with a guide recess 52*b* corresponding to the arrangement position of the LED-FPC 6. The guide recess 52*b* is a concave part that is provided to the protrusion 52. Since it is possible to slide the LED-FPC 6 in corresponding with the guide recess 52*b* by this structure, the positioning of higher precision is possible. Meanwhile, in FIG. 6, the guide recess 52*b* is provided on the upper surface 52*a* of the protrusion 52. However, even when the guide recess 52*b* is provided on the guide spacer 55 in corresponding with the arrangement position of the LED-FPC 6, the same effect is obtained. In the meantime, the other configurations are the same as the first and second illustrative embodiments.

Fourth Illustrative Embodiment

Figure 7:
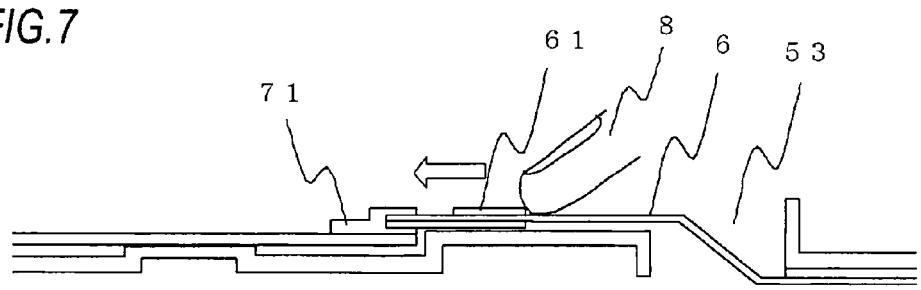
FIG. 7 is a sectional view of a display apparatus according to an illustrative embodiment of this disclosure.

FIG. 7 is a sectional view of a display apparatus according to a fourth illustrative embodiment of this disclosure. In the first to third illustrative embodiments, the structure of sliding the LED-FPC 6 toward the LED driver connector 71 by the finger 8 is adopted. However, the finger 8 may be taken away from the LED-FPC 6, so that the LED-FPC may not be slid. Accordingly, as shown in FIG. 7, a stopper 61 is arranged on the LED-FPC 6. The stopper 61 is arranged to suppress the finger 8 from being taken away from the LED-FPC 6. Thereby, since it is possible to insert the LED-FPC 6 into the LED driver connector 71 more securely, it is possible to improve the assembling operability.

What is claimed is:

1. A planar light source apparatus comprising:
   a light source;
   a flexible printed circuit (FPC), on which the light source is mounted, and which supplies power to the light source, wherein the FPC has a wiring part that extends from a light source mounting part having the light source;
   a rear frame that accommodates the light source and the FPC; and
   a driver substrate, which is arranged on a backside that is an opposite side of an inner surface of the rear frame, and which has a connector configured to connect the FPC, wherein
   an end portion of the wiring part is extracted to the backside through an opening hole formed in the rear frame and is connected to the connector, wherein
   the backside of the rear frame has a protrusion portion, which has an upper face that is arranged in the vicinity of an insertion slot of the connector into which the end portion of the wiring part of the FPC is inserted and which is formed to be substantially level with an arrangement position of the insertion slot, wherein the wiring part of the FPC is provided on the upper face of the protrusion portion, wherein
   the wiring part of the FPC, which is arranged on the inner surface of the rear frame, is accommodated on a convex part that protrudes toward the backside of the rear frame, the wiring part is accommodated on an inner side of the convex part and is fixed, and an entirety of the wiring part extending from the light source mounting part to an end of the convex part is accommodated on the inner side of the convex part, wherein
   the protrusion portion has a recess that is formed corresponding with an arrangement position of the FPC, and wherein
   the rear frame has a curved surface at a part at which at least one of the protrusion portion and the opening hole and the FPC are arranged to be adjacent to each other.

2. The planar light source apparatus according to claim 1, wherein the protrusion portion is integrally formed with the rear frame and protrudes from the rear frame.

3. The planar light source apparatus according to claim 1, wherein the protrusion portion is a spacer that is arranged on the backside of the rear frame.

4. The planar light source apparatus according to claim 1,
wherein the rear frame is formed of a material including resin, and
wherein the protrusion portion formed on the backside of the rear frame is formed by a molding.

5. The planar light source apparatus according to claim 1,
wherein the rear frame is formed of a metal thin plate, and
wherein the protrusion portion that is formed on the backside of the rear frame is formed by drawing or bending processing.

6. The planar light source apparatus according to claim 1,
wherein the FPC has a stopper,
wherein the stopper is configured to be used when the end portion of the wiring part of the FPC is inserted into the insertion slot of the connector.

7. The planar light source apparatus according to claim 1, further comprising
a frame cover, which is provided at the backside of the rear frame to cover the connector, the protrusion portion and the opening hole.

8. The planar light source apparatus according to claim 1, wherein the light source is an LED.

9. A display apparatus having a display device that displays an image and is arranged to face the planar light source apparatus according to claim 1.

10. The planar light source apparatus according to claim 1,
wherein the protrusion portion includes a backside surface that slidingly guides the end portion of the wiring part of the FPC into the insertion slot.

11. The planar light source apparatus according to claim 1, wherein the wiring part of the FPC traverses an entire width of the opening hole formed in the rear frame.

12. The planar light source apparatus according to claim 1, wherein the FPC is an LED-FPC.

13. The planar light source apparatus according to claim 1, wherein the wiring part of the FPC includes an inclined portion in the opening hole.

14. The planar light source apparatus according to claim 1, wherein the upper face of the protrusion portion is an uppermost face.

15. The planar light source apparatus according to claim 1, wherein the convex part is laterally separated from the protrusion portion by the opening hole.

16. A planar light source apparatus comprising:
a light source;
a flexible printed circuit (FPC), on which the light source is mounted, and which supplies power to the light source, wherein the FPC has a wiring part that extends from a light source mounting part having the light source;
a rear frame that accommodates the light source and the FPC; and
a driver substrate, which is arranged on a backside that is an opposite side of an inner surface of the rear frame, and which has a connector configured to connect the FPC, wherein
an end portion of the wiring part is extracted to the backside through an opening hole formed in the rear frame and is connected to the connector, and wherein
the wiring part of the FPC, which is arranged on the inner surface of the rear frame, is accommodated on a convex part that protrudes toward the backside of the rear frame, the wiring part is accommodated on an inner side of the convex part and is fixed, and an entirety of the wiring part extending from the light source mounting part to an end of the convex part is accommodated on the inner side of the convex part, wherein
the protrusion portion has a recess that is formed corresponding with an arrangement position of the FPC, and wherein
the rear frame has a curved surface at a part at which at least one of the protrusion portion and the opening hole and the FPC are arranged to be adjacent to each other.

17. The planar light source apparatus according to claim 16,
wherein the opening hole is positioned between the connector and the convex part in a lateral insertion direction of the wiring part into the connector.

* * * * *